United States Patent [19]

Bouve

[11] 4,253,151
[45] Feb. 24, 1981

[54] APPARATUS FOR MONITORING AND CONTROLLING CONSUMER POWER CONSUMPTION

[76] Inventor: Thomas T. Bouve, 5419 Lambeth Rd., Bethesda, Md. 20014

[21] Appl. No.: 957,367

[22] Filed: Nov. 3, 1978

[51] Int. Cl.³ .................. G01R 11/63; G01R 11/64
[52] U.S. Cl. .................................. 364/483; 364/492; 364/493; 324/116
[58] Field of Search ............... 364/483, 492, 493, 464; 235/92 MT, 92 EL; 324/103 R, 142, 116; 307/31

[56] References Cited

U.S. PATENT DOCUMENTS

| | | | |
|---|---|---|---|
| 3,387,121 | 6/1968 | Maczuzak et al. | 364/492 |
| 3,505,508 | 4/1970 | Leyde | 324/103 R |
| 3,517,310 | 6/1970 | Gates et al. | 324/103 R |
| 3,522,421 | 8/1970 | Miller | 364/492 |
| 3,652,838 | 3/1972 | Dillon et al. | 364/493 |
| 3,747,068 | 7/1973 | Bruner et al. | 364/512 |
| 3,998,093 | 12/1976 | Bertolasi | 364/483 |
| 4,110,825 | 8/1978 | Fox et al. | 364/492 |
| 4,117,537 | 9/1978 | Muench | 364/492 |
| 4,120,031 | 10/1978 | Kincheloe et al. | 364/464 |
| 4,146,923 | 3/1979 | Borkan | 364/492 |
| 4,147,978 | 4/1979 | Hicks | 324/142 |

Primary Examiner—Charles E. Atkinson
Assistant Examiner—Gary Chin
Attorney, Agent, or Firm—Oblon, Fisher, Spivak, McClelland & Maier

[57] ABSTRACT

An apparatus for monitoring and controlling the electrical power consumption of an electrical power consuming system, which apparatus measures and displays the rate and accumulated amount of total electrical consumption by the system, computes the average daily consumption, and signals when the average daily consumption exceeds a predetermined target as established by the consumer. Also, the apparatus generates an output indicative of peak integrated power consumption over a predetermined time period, and an indication of the precise time of occurrence thereof, to aid the consumer in his effort to isolate primary sources of power consumption. In addition, the apparatus of the invention computes the difference between the average daily consumption and the target daily consumption, which differences are displayed in order to provide a meaningful measure of the consumer's progress in controlling the amount of useage of the particular electrical power consuming system being monitored.

3 Claims, 3 Drawing Figures

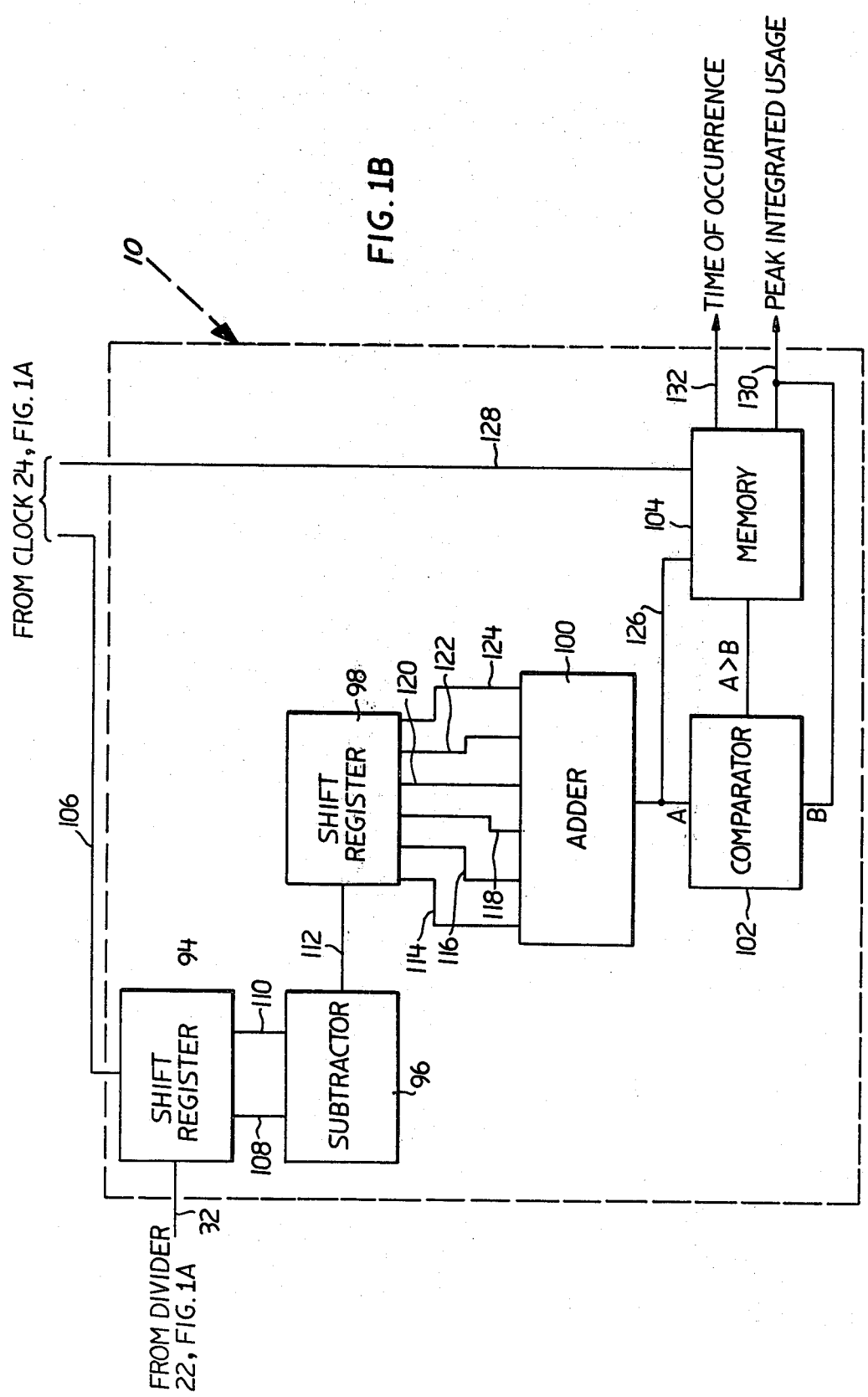

APPARATUS FOR MONITORING AND CONTROLLING CONSUMER POWER CONSUMPTION

BACKGROUND OF THE INVENTION

1. Field of the Invention

This invention relates to an electronic instrument for monitoring and controlling consumer electrical power consumption.

2. Description of the Prior Art

As is well known, in recent times considerable emphasis has been placed on energy conservation due to fuel shortages and the increased cost of fuels. However, in order to realistically control the amount of energy consumption, a consumer must first be in a position to determine the consumption of various energy consuming devices in order to determine which of these devices are high energy consumers, such that the consumption of these devices can be closely monitored and controlled.

Heretofore various instruments have been provided for monitoring domestic or commercial power consumption. For example, U.S. Pat. No. 2,010,047 to Green discloses a portable watt-hour meter which is inserted in series with the power line to a monitor device, and displays the energy consumed by this device.

Another energy consumption indicator, U.S. Pat. No. 1,704,520 to Sommer, indicates if and when a monitor device exceeds a predetermined level during a prescribed fifteen minute time interval. In the event that power consumption is not curtailed within a time period during excessive demand, the Sommer indicator includes provisions for automatically shutting off power to the device, and also includes a lamp indicator for signalling excess energy consumption during the predetermined time interval.

Yet another electric power consumption monitoring device is disclosed in U.S. Pat. No. 3,502,980 to Baggott, which monitors and displays the total energy consumed during a predetermined repeating integrating period (e.g. one-half hour). The power consumption of Baggott resets to zero at the end of the integrating period while an additional display records the highest power consumption reading registered for an integrating period during a billing period, typically a month.

While the above described prior art power consumption monitoring devices are quite helpful for the purpose of ascertaining gross power consumption and peak power consumption, these devices provide little if any information with regard to the rate of the power consumption. Furthermore, it appears that the prior art devices have no provisions for establishing power consumption targets or goals by which a consumer can effectively manage the consumption of electricity in the household or business. As a result, a need has been felt to provide an improved apparatus for monitoring and controlling electrical power consumption whereby the consumer can establish consumption target rates, and take immediate action based on present performance relative to the established target.

SUMMARY OF THE INVENTION

Accordingly, it is one object of this invention to provide a novel apparatus for more effectively monitoring and controlling electrical power consumption.

Another object of this invention is to provide a novel apparatus by which target useage levels can be established, and consumption performance monitored relative thereto.

A further object of this invention is to provide a novel apparatus to aid a consumer in the isolation of the primary sources of power consumption.

Yet another object of this invention is to provide a novel apparatus which monitors not only accumulated power consumption, but also provides continuous information as to the rate of power consumption.

Still another object of this invention is to provide a novel apparatus which monitors integrated peak power consumption over a predetermined time period, and the precise time of occurrence thereof.

A further object of this invention is to provide a novel apparatus which is highly portable and amenable to the monitoring and control of electrical power consumption of individual consumer devices.

Yet another object of this invention is to provide a novel apparatus for monitoring and controlling the large scale power consumption of an entire household or an entire business.

Another object of this invention is to provide a novel apparatus which computes the average daily power consumption of a system, and signals when the daily consumption level has exceeded a predetermined target daily consumption level.

Yet another object of this invention is to provide a novel apparatus which periodically re-computes the average daily power consumption of a system at various times each day while nevertheless accumulating total power consumption over an indeterminate time period.

Still another object of this invention is to provide a novel apparatus by which target daily consumption can be easily predetermined by a consumer.

These and other objects of this invention are achieved by providing a novel apparatus for monitoring and controlling the electric power consumption of an electrical power consuming system connected to a source of electrical power, which measures and displays the rate and accumulated amount of total electrical consumption by the system, computes the average daily consumption, and signals when the average daily consumption exceeds a predetermined target as established by the consumer. Also, the apparatus generates an output indicative of peak integrated power consumption over a predetermined time period, and an indication of the precise time of occurrence thereof, to aid the consumer in his effort to isolate primary sources of power consumption. In addition, the apparatus of the invention computes the difference between the average daily consumption and the target daily consumption, which differences are displayed in order to provide a meaningful measure of the consumer's progress in controlling the amount of useage of the particular electrical power consuming system being monitored.

The apparatus as implemented includes a circuit inserted in series between the power source and the monitored system for measuring the instantaneous power consumption of the system; a clocking circuit for providing clock pulses at predetermined time intervals; a first computing circuit coupled to the power measuring circuit and the clocking circuit for computing the total power consumption over a first time period; a second computing circuit coupled to the clocking circuit and the first computing circuit for computing the actual rate of power consumption over a second predetermined time period smaller than the first time period; an external programming capability for establishing a target rate of power consumption; a circuit for comparing the actual rate of power consumption to the programmed target rate and for producing a first signal indicative of the difference therebetween and a second signal indicative of when the actual power consumption rate exceeds the target rate; a display which displays the actual and the target power consumption rates, the difference therebetween, when the target rate is exceeded, and total power consumption of the system being monitored; and a circuit for determining and displaying the peak integrated power consumption over a predetermined time period, and the time of occurrence thereof.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIGS. 1A and 1B are schematic block diagrams of the circuit implementation of the apparatus of the invention;

DETAILED DESCRIPTION OF THE PREFERRED EMBODIMENTS

Figure 1A:
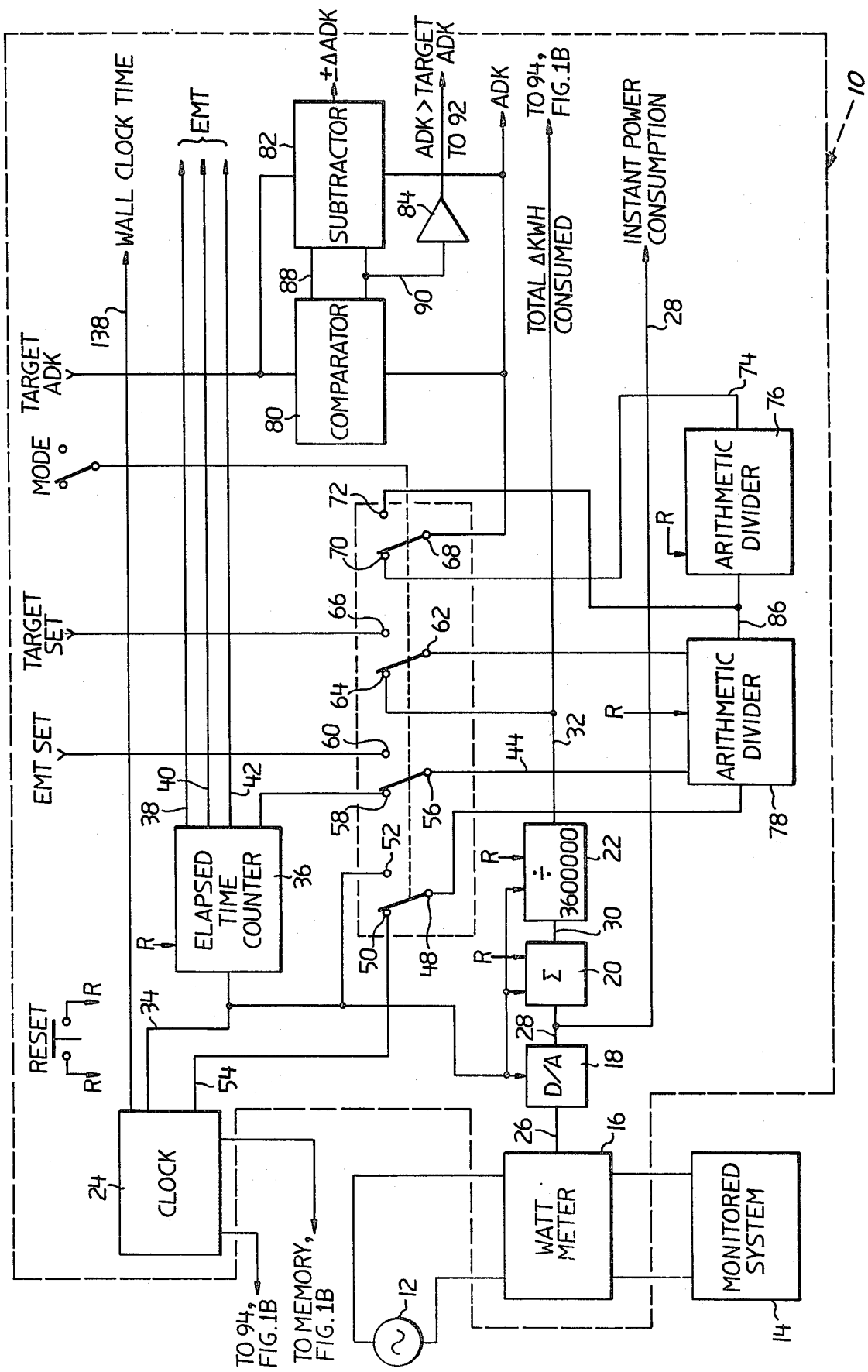

Referring now to the drawings, wherein like reference numerals designate identical or corresponding parts throughout the several views, and more particularly to FIGS. 1A and 1B thereof, the apparatus 10 of the invention, shown in dashed lines, is inserted in series between a power source 12 and a system 14, the power consumption of which is to be monitored by the apparatus 10. The apparatus 10 includes a watt meter 16 an analog to digital converter 18, an accumulator 20, an arithmetic divider 22, and a clock source 24. The watt meter 16 generates an analog signal 26 representative of the instantaneous power consumption of the monitored system 14. The output signal 26 is applied to the analog to digital converter 18 which at one second intervals generates a digitized output signal (in watt-second) representative of the power consumption of the system 14. The digitized output signal 28 is then applied to the accumulator 20, which at similar one second time intervals accumulates the total power consumption of the system 14 in watt-seconds. The output of the accumulator 30 is then applied to the arithmetic divider 22 which divides the accumulator output by $3.6 \times 10^6$ to provide an output signal 32 indicative of accumulated kilowatt hours (KWH) consumed by the system 14.

The clock source 24 produces a pulsed output signal 34 occurring at one second intervals, and thereby defines the sampling rate and accumulation rate of the analog to digital converter 18 and the accumulator 20, respectively. The pulse clock pulse 34 is also applied to an elapsed time counter 36 which monitors the total elapsed time during which the power consumption to the load system 14 is monitored. The elapsed time counter 36 generates output signals 38, 40, and 42 respectively indicative of the number of days, hours, and minutes during which the power consumption to the load system 14 is being monitored. Also, the elapsed time counter 36 similarly generates an output 44, the function of which is described in more detail hereinafter, which is indicative of the total number of accumulated hours of the monitoring period.

As also shown in FIG. 1A, the apparatus of the invention includes a quadruple-pole-double-throw switch 46. One pole 48 of the switch 46 is switched between contacts 50 and 52. Contact 50 is connected to an output 54 of the clock source 24, which output 54 is a clock pulse occurring hourly. Contact 52 on the other hand is connected to the output signal 34 which as described above is a clock pulse occurring every second. A second pole 56 of the switch 46 is switched between two contacts 58 and 60, with contact 56 connected to the total accumulated hour output 44 of the elapsed time counter 36, and the contact 60 connected to an externally programmable input, EMT SET, described in more detail hereinafter. A third pole 62 of switch 46 is switched between contact 64 and 66, with contact 64 connected to the output signal 32 of arithmetic divider 22, and contact 66 connected to an externally programmable input signal, KWH SET, also described hereinafter. The final and fourth pole 68 of switch 46 is switched between contact 70 and 72 which are respectively connected to the output 74 of an arithmetic divide-by-24 circuit 76, and a output of arithmetic divider 78, discussed below. Furthermore, the position of each pole of the switch 46 is determined by another externally programmable input signal, labeled MODE.

The apparatus of the invention further includes arithmetic divider 78, a comparator 80, a subtractor 82, and a buffer amplifier 84. The arithmetic divider 78 is provided with a division input connected to the pole 48 of switch 46, and dividend and divisor inputs respectfully connected to the poles 62 and 56 of the switch 46. The output 86 of the arithmetic divider 78 is applied to the divide-by-24 arithmetic divider 76, which in turn has an output connected to the contact 70 as discussed above. The pole 68 is connected to one input of the comparator 80, the other input of which is connected to an externally programmable signal, TARGET ADK. Similarly, the subtractor 82 is connected to the pole 68 and the externally programmable input signal TARGET ADK, while also being connected to the outputs 88 and 90 of the comparator 80. The output 90 of the comparator 80 is also applied to the buffer amplifier 74 which drives a visual display to be described in more detail hereinafter.

Operation of the apparatus of the invention is now described.

Watt meter 16 of the apparatus 10 of the invention is inserted between the power source 12 (110 volts or 220 volts at 60 hertz or the like), and the monitoring system 14, and produces an analog signal indicative of the instantaneous power consumption of the monitoring system 14. The analog output 26 of the watt meter 16 is then digitized at one second intervals by the analog to digital converter 18, and the output thereof is accumulated at one second intervals by the accumulator 20. The output 30 of the accumulator 20, in watt seconds, is then divided by $3.6 \times 10^6$ to provide a signal 32, which is externally displayed, indicative of the total power consumption of the monitored system 14.

Figure 2:
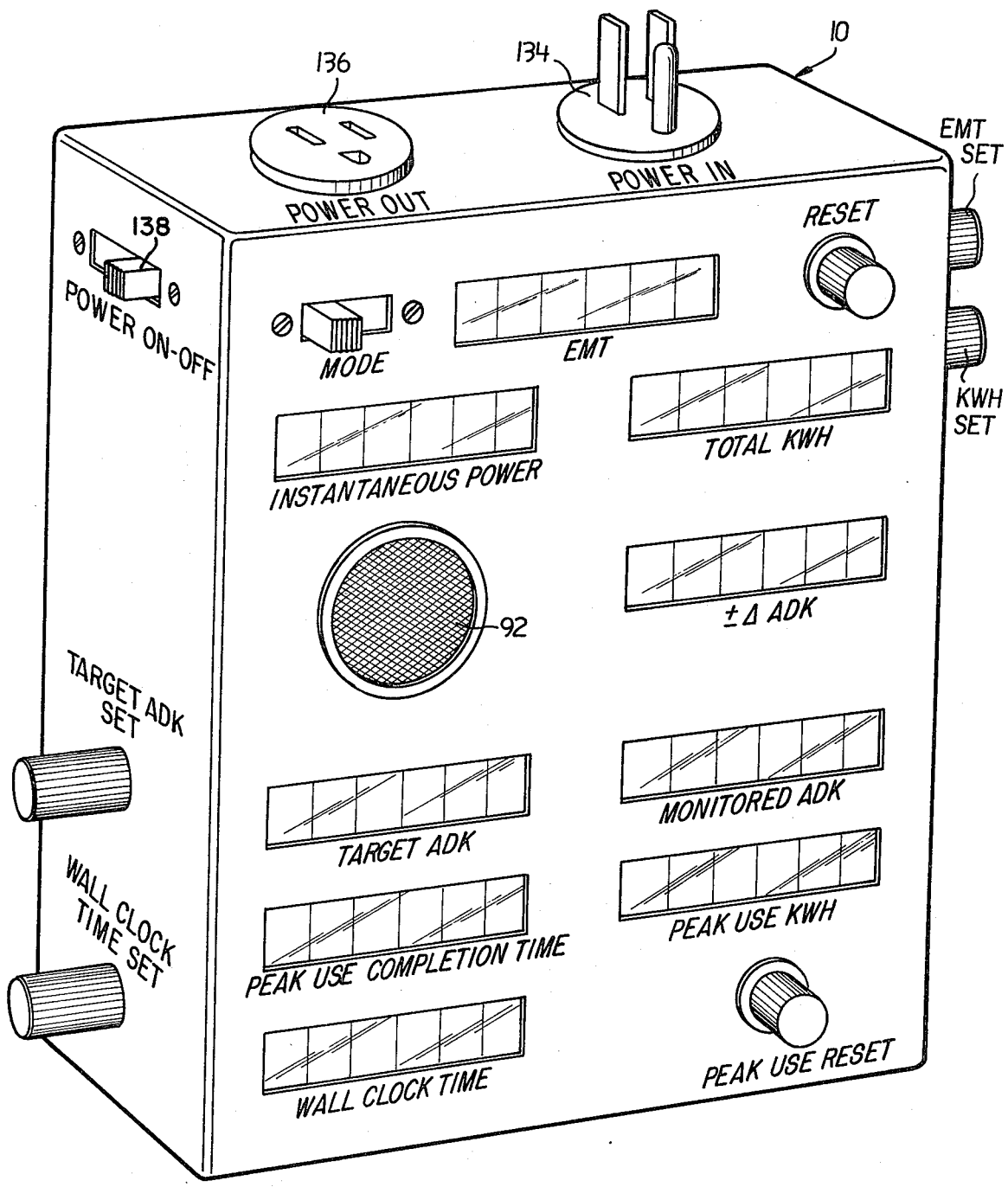
FIG. 2 is a representation of a practical implementation of the apparatus according to the invention, specifically illustrating external programmability of the apparatus, and the display provided therewith.

Under normal operating conditions, and as determined by the MODE signal, the output 32 of the divider 22 is then connected to the dividend input of the arithmetic divider 78 by means of the contact 64 and pole 62 of switch 46. The arithmetic divider 78 then divides the total monitored power consumption, as represented by the signal 32, by the total number of hours of elapsed time as indicated by the signal 44 produced in the counter 36, which computation is made by the divider 78 hourly under the control of the signal 54 at the output of the clock source 14, to provide a signal 86 indicative of the hourly rate of power consumption of the monitoring system 14. The signal 86 is then divided by twenty four by arithmetic divider 76 to provide a signal 74 indicative of the average daily kilowatt (ADK) power consumption of the monitoring system 14. The ADK signal 74 is then fed through the contact 70 and pole 68 of switch 46 to the comparator 18, the subtractor 82, and is concurrently displayed externally as shown in FIG. 2 by the ADK (average daily kilowatt hours) display.

The thusly computed ADK average daily kilowatt power consumption of the monitored system 14 is then compared by the comparator 80 against an externally applied TARGET ADK signal, which determines if in fact the monitored power consumption of the system 14 exceeds the externally programmed TARGET ADK. The arithmetic subtractor simultaneously computes the absolute value of the difference between the TARGET ADK and the monitored ADK, and produces an output signal, $\Delta$ADK, indicative thereof, which is also externally displayed (see FIG. 2). Additionally, when the TARGET ADK is exceeded by the monitored ADK signal, comparator 80 so indicates, and the subtractor 82 appropriately provides either a + or a − sign to the displayed ADK signal. Furthermore, the output signal 90 is applied to the buffer amplifier 84 which drives a display lamp 92 in the event that the TARGET ADK is exceeded.

The utility of the apparatus 10 of the invention is particularly enhanced by the ability thereof to monitor the peak integrated power consumption useage, and the time of occurrence thereof, during the monitoring period. To that end, the apparatus of the invention as shown in FIG. 1b monitors the power consumption in kilowatt hours over successive five minute intervals of the total elapsed time, and determines the peak integrated power consumption over any 30 minute time period for each successive group of five minute monitoring periods. Thus, at the end of each five minute peak integrated power consumption monitoring period, a new 30 minute peak power consumption figure is computed, to provide data which is current within five minutes. The maximum peak integrated power consumption figure for any 30 minute time period is stored in a memory, and displayed along with the time of occurrence thereof. Each successive peak integrated power consumption sum for overlapping 30 minute time periods is then compared with the previous sum stored in memory, and the memory is updated each time a larger peak integrated power consumption sum is monitored.

As shown in FIG. 1b, the circuitry dedicated to providing the display of peak integrated power consumption and time of occurrence thereof includes a shift register 94, an arithmetic subtractor 96, a shift register 98, an arithmetic adder 100, a comparator 102, and a memory 104. The shift register 94 has applied as inputs thereto the output 32 of the arithmetic divider 22, as well as a five minute clock pulse 106 which occurs every five minutes, at an output of the clock source 24. The shift register 94 is provided with two outputs 108 and 110 which are respectively indicative of the total power consumption of the monitored system 14 at successive five minute intervals. The output signals 108 and 110 are applied to the subtractor 96, which subtracts the output signal 108 from the output signal 110 to derive an output signal 112 ($\Delta$KWH) indicative of the total power consumption over successive five minute time periods. The output signal 112 is then delivered to the shift register 98 and shifted into successive stages thereof upon occurrence of each five minute clock pulse 106. A preselected number of outputs of the shift register 98, for example six outputs thereof corresponding to 30 minutes and designated as 114, 116, 118, 120, 122, and 124 ($\Delta$KWH$_1$–$\Delta$KWH$_6$), are applied to the adder circuit 100 which forms the sum thereof. Thus, the output 126 of the adder 100 is representative of the total power consumption during overlapping 30 minute time intervals, with the overlap between successive of such time intervals equaling five minutes.

The output of the adder 100 is then applied to the comparator 102 and the memory 104. Also applied to the memory 104 is a real time signal 128 produced by the clock 124 and indicative of the calendar month, day, and time of day. The memory 104 has two outputs 130 and 132 respectively indicative of the peak integrated power consumption occurring in any one of the 30 minute overlapping time intervals and the time of occurrence thereof. The output signal 130 is also applied to a second comparison input to the comparator 102 for comparison with the adder output signal 126. Whenever the output signal 126 exceeds the previous peak integrated power consumption signal 130, the contents of the memory 104 is then updated with the new peak integrated power consumption, as well as with time of occurrence thereof as indicated by the real time signal 128. As shown in FIG. 2, the signals 130 and 132 are displayed by the apparatus 10 of the invention to provide an indication of not only the peak power consumption during the 30 minute time intervals, but also the precise time of occurrence thereof, thereby enabling the consumer to identify and control the sources of power consumption.

An especially convenient feature of the apparatus of the invention lies in the ability to compute a TARGET ADK using the existing arithmetic computing circuitry of the apparatus 10 of the invention. For that purpose, the switch 46 is included herewith to disconnect the arithmetic divider 78 from the divider 22 and the elapsed time counter 36, and instead connects the divider 78 to externally programmed input signals, EMT (elapsed monitoring time) SET and KWH SET. In that event, and under the control of the externally programmed MODE signal, the poles of the switch 46 are switched to the opposite contact then as shown. Then, the arithmetic divider 78 can be conveniently used to compute a TARGET ADK figure based on externally programmable data, as for example may be obtained from past utility bills or past power consumption data. Since such past data is normally in kilowatt hours and days, the output of the arithmetic divider during the computing mode already has the units of kilowatt hours per day, and therefore the arithmetic divider 76 is bypassed for a display of the ADK signal produced at the contact 68 of the switch 46. Upon computing of the TARGET ADK system, the computed TARGET ADK system is programmed at the TARGET ADK input to the apparatus 10. Other values, of course, can be programmed as well. Thereafter, the apparatus 10 is reset by means of an externally controlled push button, and the MODE changed to commence normal operations during a next monitoring time period.

As shown in FIG. 2, the apparatus 10 of the invention can readily be configured in a conveniently portable casing having externally programmable inputs and externally visible display. Specifically, in the preferred embodiment, the apparatus of the invention displays the total elapsed time of the monitoring period, as represented by the signals 38, 40 and 42, the present time (wall clock time in units of months, days, hours, minutes) as represented by signal 138, the total power consumption during the monitored period as represented by the signal 32, the instantaneous power consumption as represented by the signal 28 at the output of the A/D converter 18, the average daily power consumption, ADK, as represented by the signal 84, the target average daily power consumption as externally programmed into the apparatus 10, and a lamp display driven by the buffer amplifier 84 indicating whether or not the monitored ADK exceeds the TARGET ADK. Also displayed is the peak integrated power consumption over a predetermined time period and time of occurrence thereof, signals 130 and 132, as discussed above.

It is noted that FIG. 2 shows a practical implementation of the embodiment described above, specifically illustrating the external programmability and display of the invention. Also shown and not previously discussed is a power-in plug 134 and a power-out socket 136 for respectively applying power to the wattmeter 16 and the monitored system 14. It is noted that power to the circuits of the apparatus is itself derived from the plug 134 by means of a conventional rectifier (not shown). Also, shown is a power ON/OFF switch 138, for controlling the application of power from the plug 134 to this rectifier.

From the above discussion, it is seen that the apparatus of the invention provides an electronic monitoring instrument that measures, computes, and provides digital displays of the rate and accumulated amount of electrical energy consumption by components (e.g. appliances and/or machinery in the household or business). The apparatus of the invention can conveniently be implemented in either portable form, or if so desired a permanently installed, wall-mounted version can be easily fabricated to monitor total electrical power consumption of an entire household or business. Quite advantageously, the apparatus of the invention enables the establishment of target power consumption goals, and the actual power consumption relative thereto. As a result of being able to monitor electrical consumption in this manner, a consumer can readily identify and control the operation of components with high electrical useage requirements, as well as components that operate needlessly. Thus, the consumer can effectively manage the consumption of electricity in the household and business, which not only results in lower consumer utility costs, but contributes significantly to the national goal of energy conservation.

Furthermore, the monitoring of the value and the occurrence of peak power usage over a sliding time period advantageously enables a consumer to isolate when, and therefore probably also why, a particular monitored system consumes maximum power. This consumption feedback information permits a consumer to monitor his performance not only in absolute terms but also in relative terms, since a relatively old peak usage signal 130, indicates that a measure of success has been achieved in curtailing power consumption. In that regard, as seen in FIG. 2, the apparatus of the invention includes a separate reset button by which the peak integrated power consumption (PEAK USE KWH) and time of occurrence thereof (PEAK USE COMPLETION TIME) can be reset at any time. Thus, since the peak power usage components and displays can be cleared at any time separate from the other components, it can be used to conserve electricity by providing a means to monitor daily peak use, and thereby to compare peak usage on a day-to-day basis.

As can be discerned from the drawings, the apparatus 10 of the invention is fabricated completely of conventional components, each of which is readily available using any one of a number of digital logic families, including CMOS, TTL etc. logic.

Obviously, numerous modifications and variations of the present invention are possible in light of the above teachings. For example, a time of occurrence signal 132 can be derived from the elapsed time counter 36, instead of using a calendar real time signal. Similarly, the ADK signal, the ΔKWH signal 112 and the peak integrated power consumption signal 126 discussed above, can optionally be established over different time intervals, and time periods, which can be externally programmable, if such is desired for a particular application. Additionally, the various circuits need not necessarily be reset synchronously but separate reset signals can be generated for various circuits as desired. It is therefore to be understood that within the scope of the appended claims, the invention may be practiced otherwise than as specifically described herein.

What is claimed as new and desired to be secured by Letters Patent of the United States is:

1. An apparatus for monitoring and controlling the electrical power consumption of an electrical power consuming system connected to a source of electrical power, comprising:

means inserted in series between said power source and said system for measuring instantaneous power consumption of said system;

clocking means for providing clock pulses at a plurality of predetermined time intervals;

first computing means coupled to said measuring means and said clocking means for computing total power consumption over a first time period;

second computing means coupled to said clocking means and said first computing means for computing actual rate of power consumption over a second predetermined time period smaller than said first time period;

first programming means for externally programming said apparatus with a target rate of power consumption;

means coupled to said second computing means and said programming means for comparing said actual rate to said target rate and producing a first signal indicative of the difference therebetween and a second signal indicative of when said actual rate exceeds said target rate;

first display means for displaying said first and second signals, said actual and target rates, and said total power consumption; and means for calculating said target rate of power consumption, comprising second programming means for externally programming said apparatus with a third time period and a target power consumption figure for said third time period, switching means for switching said second computing means from said clocking means and said first computing means to said second programming means such that said second computing means calculates said target rate of power consumption by dividing said target power consumption figure by said third time period, and for switching said second computing means back to said clocking means and said first computing means after calculation of said target rate, said first display means displaying said calculated target rate when said second computing means is coupled to said second programming means;

whereby said calculated target rate is displayed by said first display means to enable programming of the calculated target rate into said apparatus by said first programming means after calculation of said target rate.

2. An apparatus according to claim 1, further comprising:

said clocking means comprising an elapsed time counter coupled to said first time period; and second display means for displaying said elapsed time of said first time period.

3. An apparatus for monitoring and controlling the electrical power consumption of an electrical power consuming system connected to a source of electrical power, comprising:

means inserted in series between said power source and said system for measuring instantaneous power consumption of said system;

clocking means for providing clock pulses at a plurality of predetermined time intervals;

first computing means coupled to said measuring means and said clocking means for computing total power consumption over a first time period;

second computing means coupled to said clocking means and said first computing means for computing actual rate of power consumption over a second predetermined time period smaller than said first time period;

first programming means for externally programming said apparatus with a target rate of power consumption;

means coupled to said second computing means and said programming means for comparing said actual rate to said target rate and producing a first signal indicative of the difference therebetween and a second signal indicative of when said actual rate exceeds said target rate;

first display means for displaying said first and second signals, said actual and target rates, and said total power consumption;

means for generating a signal indicative of peak integrated power consumption of said monitored system over a third time period smaller than said first time period;

a memory connected to said generating means for storing said peak integrated power consumption signal and a signal indicative of the time of occurrence thereof; and means for displaying a stored peak integrated power consumption signal and the time of occurrence associated therewith;

wherein said means for generating a signal indicative of peak integrated power consumption comprises, third computing means coupled to said clocking means and said first computing means for successively generating an output signal corresponding to the total power consumption in each of a plurality of successive predetermined fourth time periods, where each fourth time period is an integral fraction of said third time period, summing means coupled to said third computing means for successively forming a sum signal indicative of the sum of a plurality of consecutive of said successive total power consumption output signals of said third computing means, said sum signal equal to the integrated power consumption over said third time period, and comparator means coupled to said memory and to said summing means for comparing the peak integrated power consumption signal stored in said memory with each sum signal formed by said summing means and for replacing the stored peak integration power consumption signal and the time of occurrence thereof stored in said memory with a sum signal, and the time of occurrence thereof, respectively, whenever said sum signal exceeds the stored integrated power consumption signal.

* * * * *